United States Patent
Chen et al.

(10) Patent No.: US 11,309,339 B2
(45) Date of Patent: Apr. 19, 2022

(54) TFT ARRAY SUBSTRATE, PREPARATION METHOD THEREOF AND DISPLAY PANEL

(71) Applicant: Wuhan China Star Optoelectronics Semiconductor Display Technology Co., Ltd., Wuhan (CN)

(72) Inventors: Cheng Chen, Wuhan (CN); Weiwei Yang, Wuhan (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 302 days.

(21) Appl. No.: 16/613,420

(22) PCT Filed: Oct. 15, 2019

(86) PCT No.: PCT/CN2019/111212
§ 371 (c)(1),
(2) Date: Nov. 14, 2019

(87) PCT Pub. No.: WO2020/252993
PCT Pub. Date: Dec. 24, 2020

(65) Prior Publication Data
US 2021/0358971 A1    Nov. 18, 2021

(30) Foreign Application Priority Data
Jun. 20, 2019 (CN) .......................... 201910534688.4

(51) Int. Cl.
*H01L 27/12* (2006.01)
*H01L 27/32* (2006.01)

(52) U.S. Cl.
CPC ...... *H01L 27/1244* (2013.01); *H01L 27/1259* (2013.01); *H01L 27/3279* (2013.01)

(58) Field of Classification Search
CPC ............. H01L 27/1244; H01L 27/1259; H01L 27/3279
See application file for complete search history.

(56) References Cited

U.S. PATENT DOCUMENTS

| 2012/0286320 | A1 | 11/2012 | Yamazaki et al. |
| 2017/0148817 | A1 | 5/2017 | Shi et al. |

(Continued)

FOREIGN PATENT DOCUMENTS

| CN | 104966696 | 10/2015 |
| CN | 107331294 | 11/2017 |

(Continued)

*Primary Examiner* — Selim U Ahmed

(57) ABSTRACT

A thin film transistor (TFT) array substrate having a display region, a pad pending region, and a wiring region connected to the display region and the pad pending region is disclosed and includes a substrate function layer and a plurality of metal layers disposed over the substrate function layer, which includes a substrate layer and all of a buffer layer, an active layer, and a first insulation layer disposed over the substrate layer, wherein the metal layers include a first metal layer, a second metal layer, and a third metal layer separately disposed within the display region and made of a same metal material including aluminum or aluminum alloy. Another aspect of the present disclosure provides a TFT array substrate, a plurality of material layers disposed therein are adopted of a material with low resistance low electrical resistance and being excellent in bending resistance.

7 Claims, 2 Drawing Sheets

(56) References Cited

U.S. PATENT DOCUMENTS

2018/0240818 A1  8/2018  Shi et al.
2020/0192507 A1* 6/2020  Bu ..................... G02F 1/13439

FOREIGN PATENT DOCUMENTS

CN  109148541  1/2019
CN  109448570  3/2019

* cited by examiner

TFT ARRAY SUBSTRATE, PREPARATION METHOD THEREOF AND DISPLAY PANEL

RELATED APPLICATIONS

This application is a National Phase of PCT Patent Application No. PCT/CN2019/111212 having International filing date of Oct. 15, 2019, which claims the benefit of priority of Chinese Patent Application No. 201910534688.4 filed on Jun. 20, 2019. The contents of the above applications are all incorporated by reference as if fully set forth herein in their entirety.

FIELD AND BACKGROUND OF THE INVENTION

The present disclosure relates to the technical field of flat displays, and specifically to a thin film transistor (TFT) array substrate, a preparation method thereof, and a display panel.

Well known, as development of display technology, flat display devices have gradually become mainstream display devices in the market, in which liquid crystal display (LCD) devices mainly occupy a large share.

In addition to advantages such as small size and light, the flat liquid crystal display devices further have other advantages of low power consumption, low radiation, soft display, and no eye injury, but that are not satisfied by manufacturers. Thus, research and development are still proceeding, in order to obtain display panels that are also light and thin but have a better display effect.

Organic light emitting diode (OLED) display panels are developed by the manufacturers. Because the OLED display panels have advantages such as light, self-illumination, wider viewing angle, low driving voltage, high luminous efficiency, low power consumption, and fast response speed, their application range is more and more widely. It is gradually recognized by the manufacturers as mainstream display panels of the next generation replacing the liquid crystal display panel.

Further, in addition to the above advantages, OLED display devices have a particularly important characteristic, that is, bendable property. Such bendable property provides an absolute advantage in portability and thus becomes focus of research and development in the industry.

Currently, a driving manner for flexible OLED display panels commonly used in the industry is realized by a thin film transistor (TFT) array substrate. Conductive metal layers disposed in the TFT array substrate generally include a first metal layer (gate layer GE1) and a second metal layer (GE2). A material used in the two metal layers is mainly Molybdenum (Mo). However, according to a following performance test, Mo is found to have relatively low electrical conductivity and poor bending resistance.

Therefore, it is necessary to develop a new TFT array substrate to overcome defects in the prior art.

SUMMARY OF THE INVENTION

An aspect of the present disclosure is to provide a thin film transistor (TFT) array substrate, a plurality of material layers disposed therein are adopted of a material with low resistance, thereby improving electrical conductivity of the material layers, and the adopted metal material is also excellent in bending resistance.

Technical schemes adopted in the present disclosure are as follows.

A thin film transistor (TFT) array substrate, having a display region, a pad bending region, and a wiring region connected to the display region and the pad bending region, wherein the TFT array substrate includes: a substrate function layer and a plurality of metal layers disposed over the substrate function layer, wherein the substrate function layer includes a substrate layer, a buffer layer, an active layer, and a first insulation layer, wherein the buffer layer, the active layer, and the first insulation layer are disposed over the substrate layer; wherein the metal layers include a first metal layer, a second metal layer, and a third metal layer separately disposed within the display region; wherein the first metal layer is disposed on the first insulation layer, a second insulation layer is disposed between the first metal layer and the second metal layer, and an inter-layered insulation layer is disposed between the second metal layer and the third metal layer; and wherein the first metal layer, the second metal layer, and the third metal layer are made of a same metal material, and the metal material includes an aluminum metal material or an aluminum alloy material.

Further, in different embodiments, an organic filling layer is disposed over the substrate layer within the pad bending region, and a plurality of parts of the third metal layer within the pad bending region are disposed on the organic filling layer in a spaced manner.

Further, in different embodiments, a barrier layer is also disposed between the organic filling layer and the substrate layer. Specifically, a thickness of the barrier layer therebetween may be between 100 and 6000 angstroms, but is not limited thereto.

Further, in different embodiments, a part of the first metal layer within the pad bending region is disposed in the organic filling layer within the pad bending region. Preferably, the part of the first metal layer within the pad bending region is disposed at a bottom of the organic filling layer, and a bottom surface thereof is directly in contact with the substrate layer or the barrier layer.

Further, in different embodiments, a part of the first metal layer within the wiring region is disposed on the first insulation layer within the wiring region. The part of the first metal layer within the wiring region has one end extending into the organic filling layer within the pad bending region, specifically, extending downwardly to a location at the bottom of the organic filling layer, but is not limited thereto.

Further, in different embodiments, the part of the first metal layer within the pad bending region is disposed in the organic filling layer within the pad bending region and is spaced apart from the part of the first metal layer within the wiring region that extends to the pad bending region.

Further, in different embodiments, a part of the second metal layer within the wiring region is disposed on the second insulation layer within the wiring region and is electrically connected to the part of the first metal layer within the pad bending region through a via hole.

Further, in different embodiments, a plurality of parts of the third metal layer within the wiring region are also disposed on the inter-layered insulation layer within the wiring region, wherein a number of the parts of the third metal layer within the wiring region is two, one of the two parts of the third metal layer within the wiring region is electrically connected to the first metal layer within the wiring region through a via hole and the other of the two parts of the third metal layer within the wiring region is electrically connected to the second metal layer within the wiring region through a via hole, respectively.

Further, in different embodiments, a planarization layer (PLN), an anode layer (ANO), a pixel definition layer (PDL), and photo spacers (PS) are also disposed over the third metal layer, wherein the anode layer is electrically connected to a part of the third metal layer within the display region through a via hole.

Further, yet another aspect of the present disclosure provides a preparation method of the TFT array substrate according to the present disclosure, and the preparation method includes steps as follows:

a step S1 for manufacturing a substrate function layer that provides a substrate layer having a display region, a wiring region, and a pad bending region; wherein a buffer layer, an active layer, and a first insulation layer are deposited over the substrate layer in sequence;

a step S2 for manufacturing a first metal layer that is deposited on the first insulation layer, and patterning the first metal layer to form a pattern of the first metal layer as a first gate metal layer within the display region;

a step S3 for manufacturing a second insulation layer that is deposited on the first metal layer, manufacturing a second metal layer on the second insulation layer, and patterning the second metal layer to form a pattern of the second metal layer as a second gate metal layer within the display region;

a step S4 for manufacturing an inter-layered insulation layer that is deposited on the second metal layer; and a step S5 for manufacturing a third metal layer that is deposited on the inter-layered insulation layer, and patterning the third metal layer to form a pattern of the third metal layer as a source/drain metal layer within the display region.

Further, in different embodiments, in the step S1, also includes a step of forming downwardly a first deep hole on a surface of the first insulation layer within the pad bending region, and in the step S4, also includes a step of forming downwardly a second deep hole on the inter-layered insulation layer within the pad bending region, wherein the second deep hole communicates with the first deep hole, and the first deep hole and the second deep hole are filled with an organic photoresist material to form an organic filling layer.

Further, in different embodiments, in the step S2, the patterning the first metal layer also includes a step of forming a part of the first metal layer within the wiring region and a part of the first metal layer within the pad bending region, wherein the part of the first metal layer within the wiring region extends into the organic filling layer within the pad bending region; and the part of the first metal layer within the pad bending region is located in the organic filling layer and is spaced apart from the part of the first metal layer within the wiring region that extends to the organic filling layer.

Further, in different embodiments, in the step S3, the patterning the second metal layer also includes a step of forming a part of the second metal layer within the wiring region on the second insulation layer within the wiring region, wherein the part of the second metal layer within the wiring region is electrically connected to the part of the first metal layer within the pad bending region through a via hole.

Further, in different embodiments, in the step S4, the patterning the third metal layer also includes a step of forming two parts of the third metal layer within the wiring region spaced apart from each other on the inter-layered insulation layer within the wiring region, wherein one of the two parts of the third metal layer within the wiring region is electrically connected to the first metal layer within the wiring region through a via hole and the other of the two parts of the third metal layer within the wiring region is electrically connected to the second metal layer within the wiring region through a via hole, respectively.

Further, in different embodiments, in the step S4, the patterning the third metal layer includes a step of forming a plurality of parts of the third metal layer within the pad bending region separately disposed on the organic filling layer within the pad bending region.

Further, yet another aspect of the present disclosure provides a display panel, which includes the TFT array substrate according to the present disclosure.

Further, in different embodiments, the display panel is a flexible organic light emitting diode (OLED) display panel.

A TFT array substrate according to the present disclosure is achieved by selecting a new metal material such as aluminum or aluminum alloy to fabricate the first metal layer (gate layer GE1), the second metal layer (GE2), and the third metal layer (SD). By utilizing low electrical resistance of the metal material such as aluminum or aluminum alloy, electrical conductivity of each metal layer is effectively improved, and bending resistance of the metal material such as aluminum or aluminum alloy is relatively good.

Further, because each metal layer over the array substrate is made of the same metal material, such that increases a possibility of changing a design of wiring between different metal layers made of the same metal material, which also makes that the preparation method of the TFT array substrate according to the present disclosure is achieved by adopting a design of wiring for a new metal material combined with a bottom edge (border), which may realize a design of double-layered wiring within a pad bending region by using a small number of masks, thereby improving IR Drop effect.

In addition, because the first metal layer (gate layer GE1) disposed within the pad bending region is a metal layer usable for a wiring of data lines, such that the wiring of the data lines can be fully moved down, and thus is closer to a neutral plane (i.e., a polyimide (PI) layer). Namely, a distance between the wiring of the data lines and the neutral plane is reduced, thereby helping to improve bending reliability of the pad bending region and reduce risk of disconnection.

BRIEF DESCRIPTION OF THE SEVERAL VIEWS OF THE DRAWINGS

In order to illustrate technical solutions of embodiments of the present disclosure more clearly, drawings required in a description of the embodiments will be briefly introduced below. Obviously, the drawings in the following description are merely some embodiments of the present disclosure. Accordingly, other drawings may be obtained from those skilled in the art without any creative work.

DESCRIPTION OF SPECIFIC EMBODIMENTS OF THE INVENTION

Figure 1:
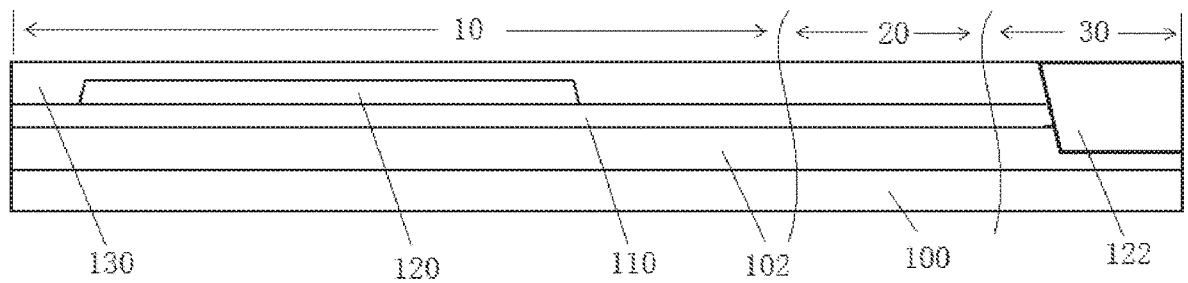
FIG. 1 is a schematic diagram illustrating that a step S1 of a preparation method of a thin film transistor (TFT) array substrate is completed, according to an embodiment of the present disclosure.

It will be further described in detail below with reference to drawings and embodiments for technical solutions of a thin film transistor (TFT) array substrate, a preparation method thereof, and a display panel, according to the present disclosure.

The present disclosure relates to a TFT array substrate and a method for preparing the same. In order to avoid unnecessary repetition, the TFT array substrate according to the present disclosure will be described in detail below in conjunction with the preparation method of the TFT array substrate, according to the present disclosure.

One embodiment of the present disclosure is to provide a preparation method of the TFT array substrate, and the preparation method includes steps as follows.

A step S1 is for manufacturing a substrate function layer, which provides a substrate layer 100 having a display region 10, a wiring region 20, and a pad bending region 30.

A barrier layer (M/B layer) 102, a buffer layer 110, an active layer 120, and a first insulation layer (GI1) 130 are deposited over the substrate layer 100 in sequence. The substrate layer 100 may adopt a structure of double-layered polyimide (PI), but is not limited thereto. In addition, the barrier layer (M/B layer) 102 may adopt an inorganic layer composed of inorganic materials, but is not limited thereto.

Then, a first deep hole (DH) 122 is formed on a surface of the first insulation layer 130 within the pad bending region, wherein the first deep hole 122 may reach to a surface of the substrate layer 100. Alternatively, the first deep hole 122 may go deep into the barrier layer 102 but does not run through there, such that a thinner barrier layer 102 still exists between the first deep hole 122 and the substrate layer 100 and has a thickness between 100 and 6000 angstroms, which is completed as shown in FIG. 1, in which the first deep hole 122 does not run through the barrier layer 102.

Figure 2:
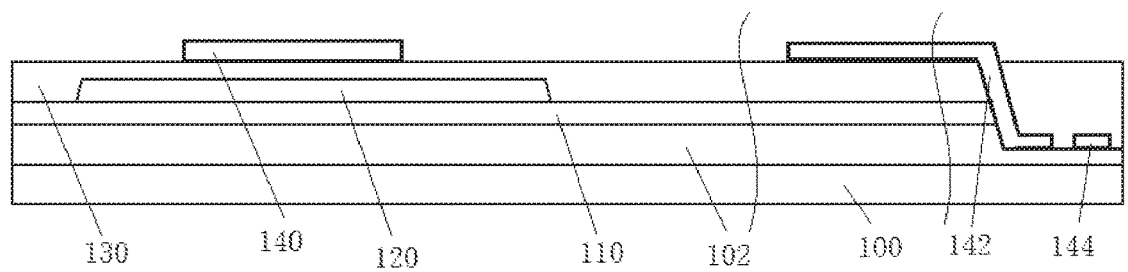
FIG. 2 is a schematic diagram illustrating that a step S2 of the preparation method of the TFT array substrate as shown in FIG. 1 is completed.

A step S2 is for manufacturing a first metal layer that is formed on the first insulation layer 130 and a bottom surface of the first deep hole 122 within the pad bending region, and patterning the first metal layer, in which a structure is completed, as shown in FIG. 2.

As shown in the figure, besides that a part of the first metal layer 140 as a first gate metal layer is formed on the first insulation layer 130 within the display region, a part of the first metal layer 142 is also disposed on the first insulation layer 130 within the wiring region and extends downwardly onto a bottom surface of the first deep hole 122 within the pad bending region. The part of the first metal layer extending from the wiring region to the pad bending region is defined as the part of the first metal layer 142 within the wiring region. In addition, a part of the first metal layer 144 within the pad bending region is further disposed on the bottom surface of the first deep hole 122 within the pad bending region and is spaced apart from the part of the first metal layer 142 within the wiring region that extends to the pad bending region. A material adopted in the first metal layer according to the present disclosure is different from a metal material such as Molybdenum (Mo) in the prior art, but a metal material such as aluminum or aluminum alloy is adopted.

Figure 3:
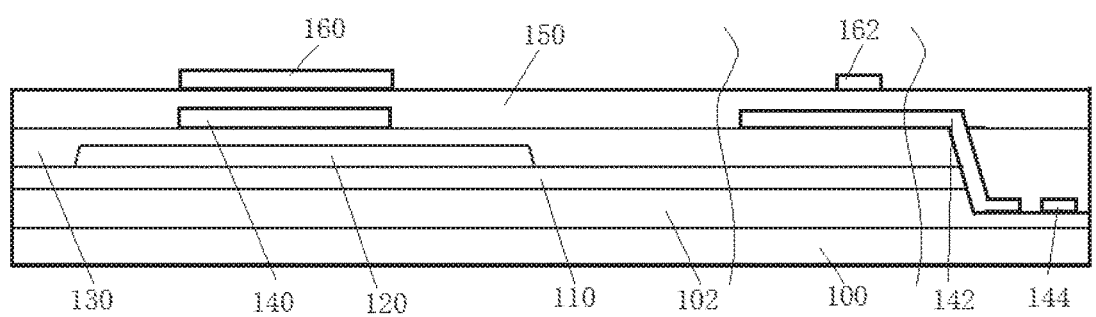
FIG. 3 is a schematic diagram illustrating that a step S3 of the preparation method of the TFT array substrate as shown in FIG. 1 is completed.

A step S3 is for manufacturing a second insulation layer and a second metal layer, wherein the second insulation layer (GI2) 150 is deposited on the first metal layer 140, the second metal layer 160 is on the second insulation layer 150 and is patterned, in which a structure is completed, as shown in FIG. 3.

As shown in the figure, besides that a part of the second metal layer 160 as a second gate metal layer (GE2) is formed on the second insulation layer 150 within the display region, a part of second metal layer 162 within the wiring region is also disposed on the second insulation layer within the wiring region 20. A material of the second metal layer is preferably also a metal material such as aluminum or aluminum alloy. In addition, the part of the second metal layer 162 within the wiring region is electrically connected to the part of the first metal layer 144 within the pad bending region through a via hole, but which is not shown, due to a viewing angle issue.

Figure 4:
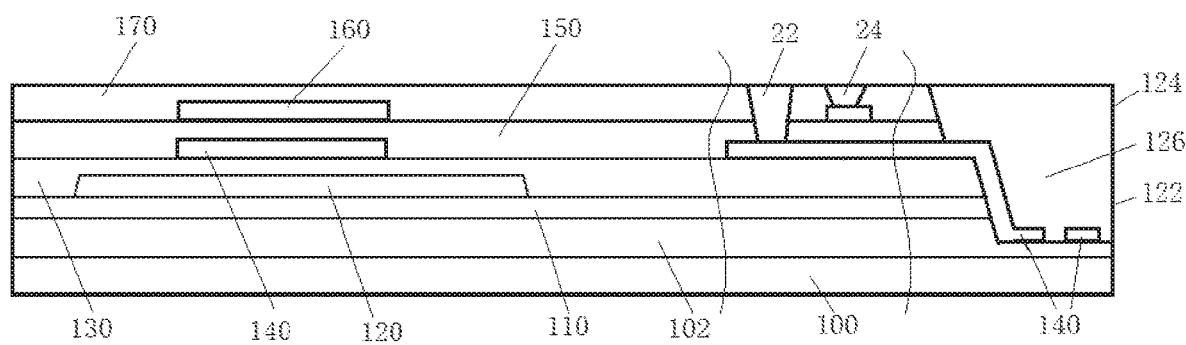
FIG. 4 is a schematic diagram illustrating that a step S4 of the preparation method of the TFT array substrate as shown in FIG. 1 is completed.

A step S4 is for manufacturing an inter-layered insulation layer and an organic filling layer, wherein the inter-layered insulation layer (ILD) 170 is deposited on the second metal layer 160. A first via hole 22 and a second via hole 24 are formed at locations on the inter-layered insulation layer 170 within the wiring region. In addition, a second deep hole 124 is formed at a location within the pad bending region, wherein the second deep hole 124 runs downwardly through the inter-layered insulation layer 170 and communicates with the first deep hole 122. An organic photoresist material (ODH) is filled into the first deep hole 122 and the second deep hole 124 to form the organic filling layer 126, in which a structure is completed, as shown in FIG. 4.

Figure 5:
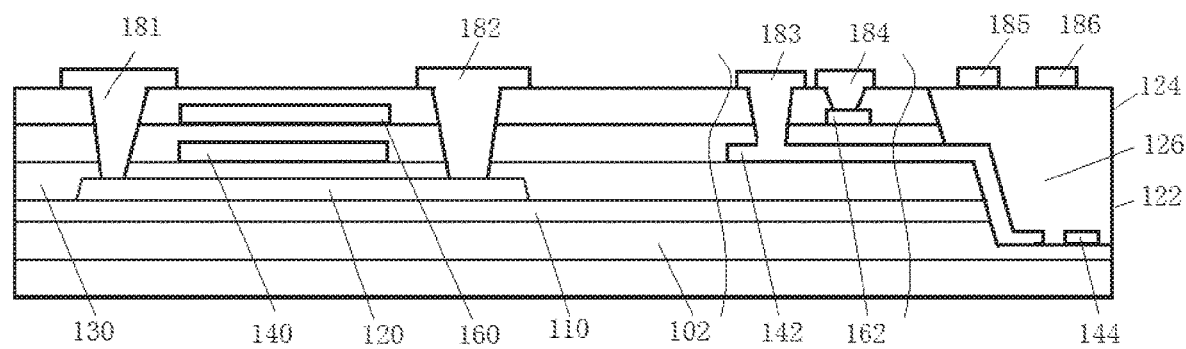
FIG. 5 is a schematic diagram illustrating that a step S5 of the preparation method of the TFT array substrate as shown in FIG. 1 is completed.

A step S5 is for manufacturing a third metal layer 180, which is deposited on the inter-layered insulation layer 170, that is, a source/drain (SD) metal layer is deposited and is patterned, in which a structure is completed, as shown in FIG. 5. As shown in the figure, all parts of the third metal layer are disposed within the display region, the wiring region, and pad bending region.

Specifically, two of the parts of the third metal layer 181 and 182 as the source/drain metal layer within the display region are connected to an active layer 120, but may also be connected to the gate metal layer (GE1) 140 in other embodiments, as demanded, and are not limited thereto.

Specifically, a number of the parts of the third metal layer within the wiring region is two, for ease of distinction, which two of the parts are defined as a "first part" of the third metal layer 183 within the wiring region and a "second part" of the third metal layer 184 within the wiring region, in which one is connected to the part of the first metal layer 142 within the wiring region through the first via hole 22 and the other is connected to the part of the second metal layer 162 within the wiring region through the second via hole 24, respectively.

Within the pad bending region, another two of the parts of the third metal layer are spaced apart from each other and formed on the organic filling layer (ODH) 126, for ease of distinction, which are defined as a "first part" of the third metal layer 185 within the pad bending region and a "second part" of the third metal layer 186 within the pad bending region.

Figure 6:
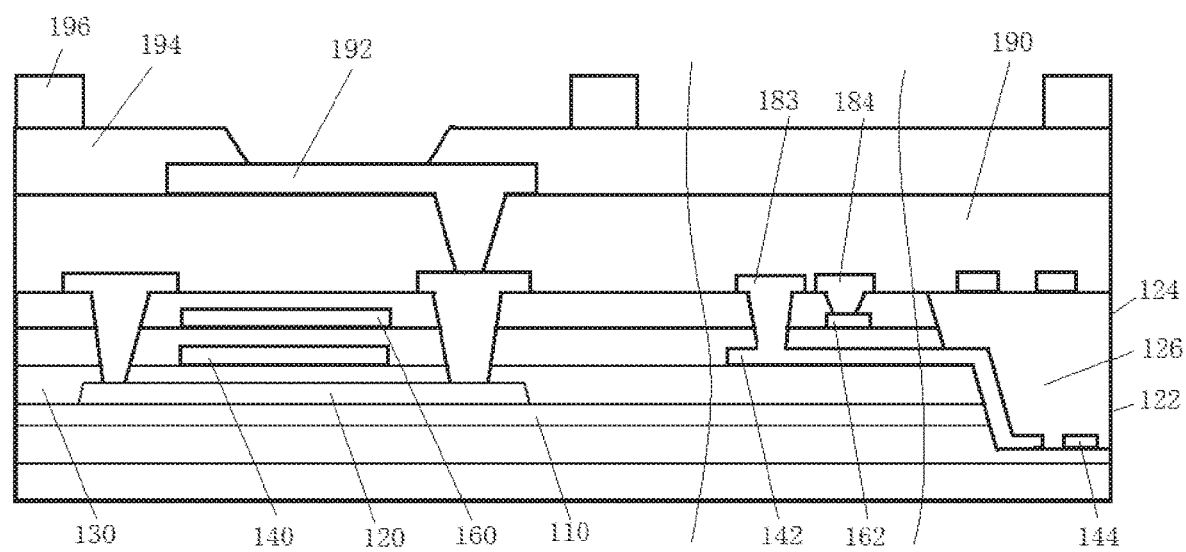
FIG. 6 is a schematic diagram illustrating that all steps of the preparation method of the TFT array substrate as shown in FIG. 1 are completed.

Further, a planarization layer (PLN) 190, an anode layer (ANO) 192, a pixel definition layer (PDL) 194, and photo spacers (PS) 196 are also continuously disposed over the parts of the third metal layer, in which a structure is completed, as shown in FIG. 6. So far, the TFT array substrate according to the present disclosure has been completed.

A TFT array substrate according to the present disclosure is achieved by selecting a new metal material such as aluminum or aluminum alloy to fabricate the first metal layer (gate layer GE1), the second metal layer (GE2), and the third metal layer (SD). By utilizing low electrical resistance of the metal material such as aluminum or aluminum alloy, electrical conductivity of each metal layer is effectively improved, and bending resistance of the metal material such as aluminum or aluminum alloy is relatively good.

Further, because the first, second, and third metal layers over the array substrate are made of the same metal material, such that increases a possibility of changing a design of wiring between different metal layers made of the same metal material, which also makes that the preparation method of the TFT array substrate according to the present disclosure is achieved by adopting a design of wiring for a new metal material combined with a bottom edge (border), which may realize a design of double-layered wiring within a pad bending region by using a small number of masks, thereby improving IR Drop effect.

Specifically, in an embodiment for a wiring of data lines, which may be adjacent data signal lines to the source/drain layer (i.e., the parts of the third metal layer 181 and 182) within the display region, and extend to the wiring region to be the "first part" of the third metal layer 183 within the wiring region and the "second part" of the third metal layer 184 within the wiring region, in which one is wired to the part of the first metal layer 142 within the wiring region through the first via hole 22 and the other is wired to the part of the second metal layer 162 within the wiring region through the second via hole 24, respectively.

The part of the first metal layer 142 within the wiring region directly extends to the pad bending region. The part of the second metal layer 162 within the wiring region extends to the pad bending region and is wired to the part of the first metal layer 144 within the pad bending region through a via hole, in which a design for the data signal lines under the organic filling layer (ODH) 126 within the pad bending region is formed.

Further, because the part of the first metal layer 144 disposed within the pad bending region is a metal layer usable for a wiring of the data lines, such that the wiring of the data lines can be fully moved down, and thus is closer to a neutral plane. Namely, a distance between the data line wiring and the neutral plane is reduced, thereby helping to improve bending reliability of the pad bending region and reduce risk of disconnection.

Further, in an embodiment for a wiring of ELVDD signal lines, when the ELVDD signal lines adjacent to the source/drain layer (i.e., the parts of the third metal layer 181 and 182) within the display region extend through the wiring region, a multiple-segmented structure may be adopted, that is, wired onto the "first part" of the third metal layer 183 within the wiring region and the "second part" of the third metal layer 184 within the wiring region.

Then, the multiple-segmented ELVDD signal lines presented as the parts of the third metal layer 183 and 184 within the wiring region may extend as a spaced wiring to the pad bending region, wherein a part of the spaced wiring is wired to the part of the first metal layer 142 within the wiring region via the parts to go through the pad bending region, and the other part of the spaced wiring is wired to the third metal layer 185 and 186 within the pad bending region for extending through the pad bending region. Thus, a wiring of double-layered ELVDD within the pad bending region is formed.

Further, in yet another embodiment for a wiring of ELVDD signal lines, when the ELVDD signal lines adjacent to the source/drain layer within the display region extend through the wiring region, a multiple-segmented structure may be adopted, that is, wired onto the "first part" of the third metal layer 183 within the wiring region and the "second part" of the third metal layer 184 within the wiring region.

Then, the multiple-segmented ELVDD signal lines presented as the parts of the third metal layer 183 and 184 within the wiring region may extend through the pad bending region via the third metal layer 185 and 186 within the pad bending region.

Further, yet another embodiment of the present disclosure provides a display panel, which includes the TFT array substrate according to the present disclosure, wherein the display panel is preferably a flexible organic light emitting diode (OLED) display panel, but is not limited thereto.

The technical scope of the present disclosure is not limited to the above description, and those skilled in the art can make various modifications and changes to the above embodiments without departing from the technical idea of the present disclosure. The modifications and changes are within the scope of the present disclosure.

What is claimed is:
1. A thin film transistor (TFT) array substrate, having a display region, a pad bending region, and a wiring region connected to the display region and the pad bending region, wherein the TFT array substrate comprises:
   a substrate function layer and a plurality of metal layers disposed over the substrate function layer, wherein the substrate function layer comprises a substrate layer, a buffer layer, an active layer, and a first insulation layer, wherein the buffer layer, the active layer, and the first insulation layer are disposed over the substrate layer;
   wherein the metal layers comprise a first metal layer, a second metal layer, and a third metal layer separately disposed within the display region;
   wherein the first metal layer is disposed on the first insulation layer, a second insulation layer is disposed between the first metal layer and the second metal layer, and an inter-layered insulation layer is disposed between the second metal layer and the third metal layer;
   wherein the first metal layer, the second metal layer, and the third metal layer are made of a same metal material, which comprises aluminum or aluminum alloy;
   wherein an organic filling layer is disposed over the substrate layer within the pad bending region, and a plurality of parts of the third metal layer are disposed on the organic filling layer in a spaced manner;
   wherein a part of the first metal layer within the pad bending region is disposed in the organic filling layer within the pad bending region; and
   wherein a part of the second metal layer within the wiring region is further disposed on the second insulation layer within the wiring region and is electrically connected to the part of the first metal layer within the pad bending region through a via hole.
2. The TFT array substrate as claimed in claim 1, wherein a barrier layer is further disposed between the organic filling layer and the substrate layer, and a thickness of the barrier layer is between 100 and 6000 angstroms.

3. The TFT array substrate as claimed in claim 1, wherein a part of the first metal layer within the wiring region is disposed on the first insulation layer within the wiring region and has one end extending into the organic filling layer within the pad bending region.

4. The TFT array substrate as claimed in claim 3, wherein a plurality of parts of the third metal layer within the wiring region are further disposed on the inter-layered insulation layer within the wiring region and one of the parts is electrically connected to the part of the first metal layer within the wiring region through the via hole.

5. The TFT array substrate as claimed in claim 1, wherein a plurality of parts of the third metal layer within the wiring region are further disposed on the inter-layered insulation layer within the wiring region and one of the parts is electrically connected to the part of the second metal layer within the wiring region through the via hole.

6. A preparation method of the TFT array substrate as claimed in claim 1, comprising:
- a step S1, manufacturing a substrate function layer that provides a substrate layer having a display region, a wiring region, and a pad bending region; wherein a buffer layer, an active layer, and a first insulation layer are deposited over the substrate layer in sequence;
- a step S2, manufacturing a first metal layer that is deposited on the first insulation layer, and patterning the first metal layer to form a pattern of the first metal layer as a first gate metal layer within the display region;
- a step S3, manufacturing a second insulation layer that is deposited on the first metal layer, manufacturing a second metal layer on the second insulation layer, and patterning the second metal layer to form a pattern of the second metal layer as a second gate metal layer within the display region;
- a step S4, manufacturing an inter-layered insulation layer that is deposited on the second metal layer; and
- a step S5, manufacturing a third metal layer that is deposited on the inter-layered insulation layer, and patterning the third metal layer to form a pattern of the third metal layer as a source/drain metal layer within the display region.

7. A display panel, comprising the TFT array substrate as claimed in claim 1.

* * * * *